United States Patent [19]

Monacelli et al.

[11] Patent Number: 5,291,373
[45] Date of Patent: Mar. 1, 1994

[54] TERMINAL BLOCK ARRANGEMENT FOR A TIMER DEVICE OR THE LIKE

[76] Inventors: John Monacelli, 2596 Gregory St., Yorktown Heights, N.Y. 10598; Buddhisagar Shah, 31 Hudson Ave., Irvington, both, N.Y. 10533

[21] Appl. No.: 887,155

[22] Filed: May 22, 1992

[51] Int. Cl.$^5$ .......................... H05K 7/02; H01R 9/00
[52] U.S. Cl. ..................................... 361/760; 361/823
[58] Field of Search ............... 361/397, 399, 400, 401, 361/407, 426; 174/250, 260, 267

[56] References Cited

U.S. PATENT DOCUMENTS 3,766,550 10/1973 Vandemore et al. ............... 174/250
4,030,802 6/1977 Lennon et al. .

Primary Examiner—Leo P. Picard
Assistant Examiner—Bot Ledynh

[57] ABSTRACT

A terminal block arrangement for a timer device or system; which enables suitable heat dissipation wherein the terminal block is handling currents of the order of at least 30 amps, such that heat dissipation is a problem because the dissipation is limited either by the PC board track or, if wire is used, by the heat conduction of the wire. The terminal design of the present invention is unique because the terminal block provides the combined advantages of access to the end user, is a source of heat sinking required by the relay, is a reliable integral connection between relay and output, and by changing the size of the terminal, can provided an almost unlimited use for AC and DC applications requiring high voltages and currents. The relay connections can be welded or soldered.

6 Claims, 2 Drawing Sheets

TERMINAL BLOCK ARRANGEMENT FOR A TIMER DEVICE OR THE LIKE

BACKGROUND OF THE INVENTION

The present invention relates to a terminal block arrangement for a timer device or system in which relatively low values of currents are involved, for the most part, in the timer circuitry which is mounted on a printed circuit (PC) board. The terminal block assembly or arrangement is particularly used in conjunction with electronic timing circuitry to provide the required high current and voltage values involved in switching loads on and off at appropriate times. The on and off switching is carried out by relays judiciously connected to the electronic timing circuitry.

Conventional designs have the characteristic that the components are placed in an area inaccessible to the end user. Typically, a case is provided for the timer device and the front side thereof is provided with a suitable opening for a display and an area for pushbutton controls directed to the selection of the day, hour, or minute, and so forth. At the bottom of the front side of the case, a terminal block is provided for circuitry output, that is, suitable load connections are to be made so as to accomplish the required switching of loads on and off. Such loads can be, for example, lamps, air conditioners, etc.

Depending on the load requirements, conventional design provides connection from the relay which is performing the on and off functions to the terminal area either by the PC board conductors, or by soldering wire from the relay terminals to the board area in which the terminal block is disposed or situated.

Accordingly, it will be apparent to the man skilled in the art that the current design in handling such requirements is deficient because: (1) the PC board conductor is a limiting factor in the current capacity of the timer; in other words, the typical board conductor is very limited in current capacity; (2) using additional wiring simply increases the cost due to the required wire and labor involved in connecting the relay board to the end user terminal board area; additionally, when wiring is used to reach the terminal block, additional soldered or welded contacts have to be made which introduce further contact resistance.

It is therefore a primary object of the present invention to overcome the deficiencies present with conventional design and construction of terminal block arrangements for timer or other electronic devices, which involve components being placed in areas inaccessible to the end user, but in which circuitry output is to be by means of a terminal block to which load connections are to be made. The latter must be accessible but, must importantly, must be capable of carrying the relatively high currents involved, in the order of at least 30 amperes. Furthermore, the heat dissipation must be ample such that UL or other regulatory requirements can be met for the allowable temperature rise.

SUMMARY OF THE INVENTION

The above-noted deficiencies have been suitably overcome by the terminal block assemby of the present invention, according to which the following advantages are realized: access to the end user and a source of heat sinking required by the relays is provided; a reliable integral connection between relay and output is also provided; and by changing the size of the terminal, there is provided an almost unlimited use for AC and DC applications requiring high voltages and currents.

Briefly stated, the present invention is defined as a terminal block arrangement for a timer device or system comprising: a circuit board having mounted thereon a low current circuit in which the current is approximately 1 to 10 amps, said circuit including a plurality of interconnected components; a relay connected in said low current circuit, said relay having contacts for closing a separate, normally open, high-current circuit, the current therein being at least 30 amps; said relay having a case and leads connected internally of said case to said contacts and extending from said case; a terminal block assembly having at least two spaced terminal bus bars with one end of each bus bar disposed below said relay; means for directly connecting said leads to the ends of said bus bars.

Other and further objects, advantages and features of the present invention will be understood by reference to the following specification in conjunction with the annexed drawings, wherein like parts have been given like numbers.

DESCRIPTION OF PREFERRED EMBODIMENT

Figure 1:
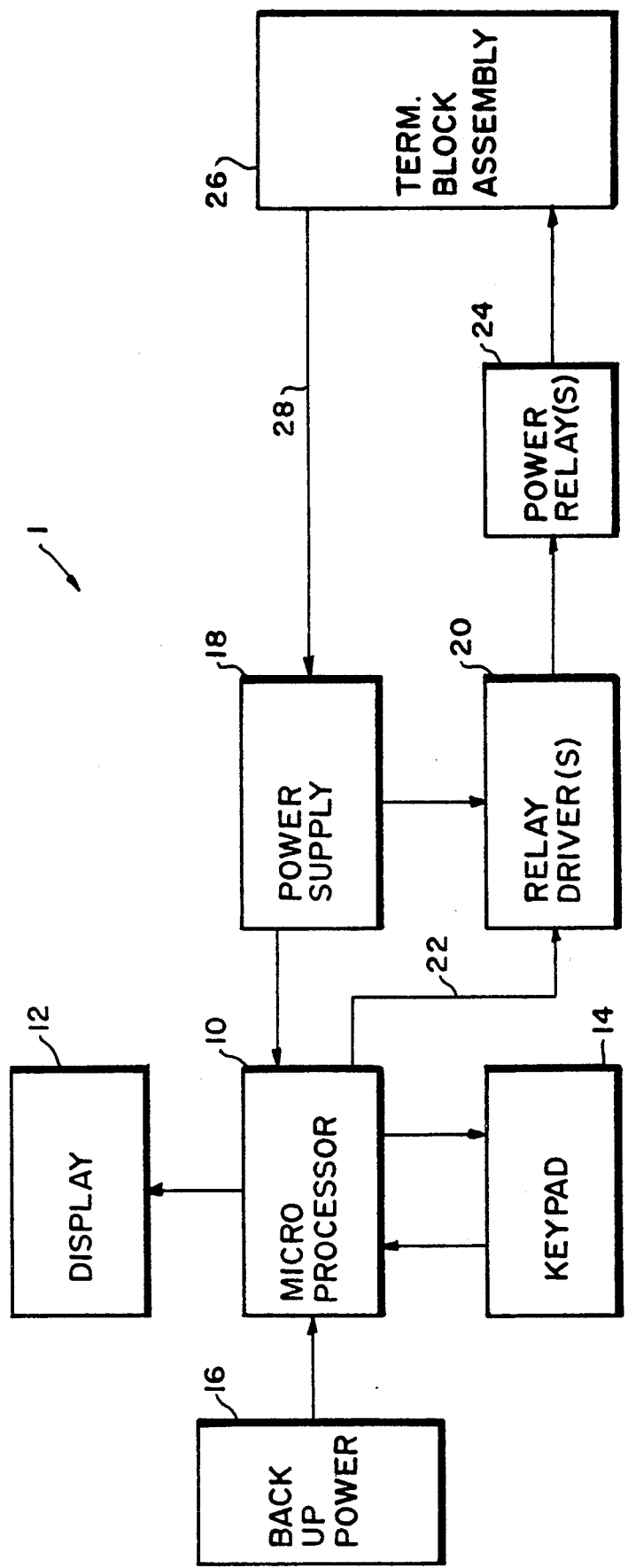
FIG. 1 is a block diagram depicting in simplified form the basic components of a timer device or system in which the present invention is incorporated.

Referring now to the figures of the drawing, a preferred embodiment looked at as a complete timer system 1 is seen in the block diagram of FIG. 1.

The timer system includes at its heart a microprocessor 10 suitable connected to a typical display 12 and to a keypad 14 to be operated by the user.

It will be noted that the main power supply 18 is connected to microprocessor 10 and to the relay drivers 20 so that a normal supply of power will be available. A signal connection 22 extends from the microprocessor to the input of the relay driver 20 so as to control their action.

A source of backup power 16 is included to take care of emergency situations so as to avoid loss of information in memory within the microprocessor 10.

The block designated 24, denominated power relays, refers to relays controlling the on/off switching of relatively high values of current of at least 30 amps; such high current being furnished by way of the terminal block assembly 26 to loads being controlled by the timer device or system. Incoming AC power to the terminal block assembly 26 is connected to the internal power supply 18 by the connection 28.

Figure 2A:
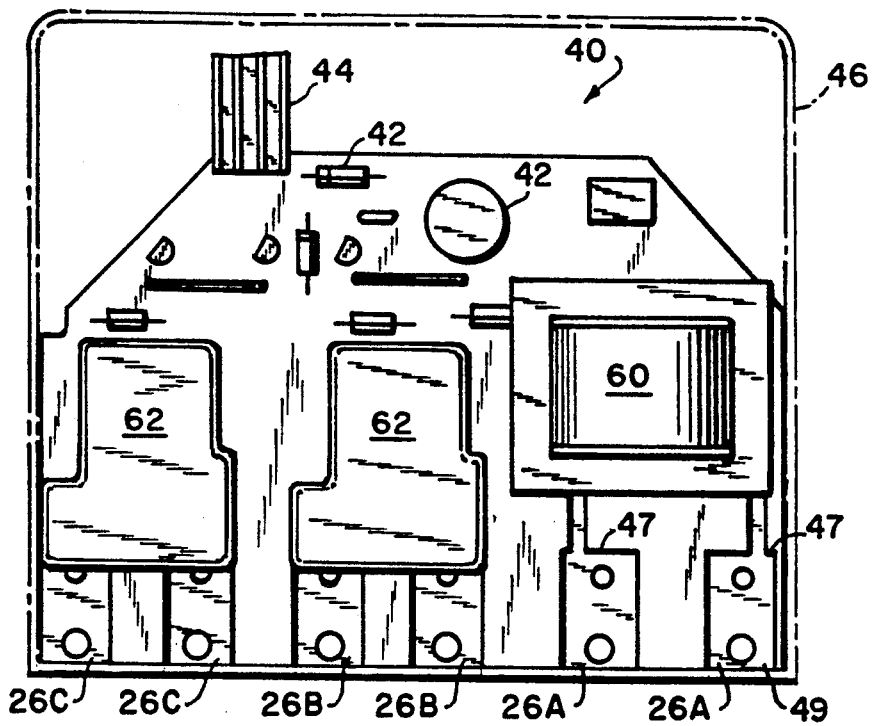
FIG. 2A is a plan view of the rear side of a printed circuit board portion on which the relays and similar components are mounted.
Figure 2B:
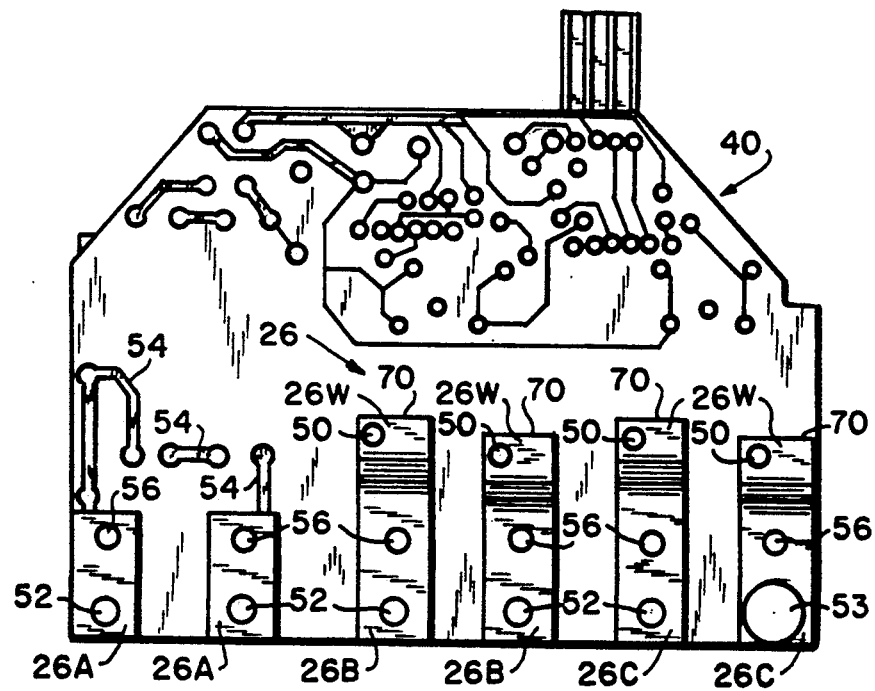
FIG. 2B is a plan view of the front side of the circuit board portion.

Referring now to the circuit layout for the timer system seen in FIGS. 2A and 2B the upper figure, that is FIG. 2A, shows the rear of a conventional circuit board 40 on which a variety of electrical components 42 are appropriately disposed. There is seen a flat multiple conductor connection 44 which is broken away to indicate connection to another circuit board, not illustrated, which is adapted to contain a variety of other components, including the micro-processor 10 previously alluded to. Also included on that other circuit board is the display means 12, as well as a variety of push buttons for controlling the various timing device parameters.

The components of particular interest here are the ones which are suitably connected to the terminal block assembly 26, already noted in connection with FIG. 1, such assembly comprising pairs of terminal block bus bars, preferably composed of copper. In particular, bus bar pairs 26A, 26B, and 26C, are seen to extend on the front side of the printed circuit board to the lower edge thereof, having rectangular shaped configurations which are presented to the user at the front side of the casing 46 by dint of openings (not see) formed through the casing. The circuit board 40 is specially fitted to the casing and held in place by reason of a slot 49 formed at the rear side in the lower part of the casing 46.

It should be especially noted that FIGS. 2A and 2B are rotationally related; that is, FIG. 2A illustrates the rear side of the printed circuit board 40, and as a result of turning the board 180 degrees on a vertical axis there appears, as shown in FIG. 2B, the front side of the board 40. In FIG. 2A a transformer 60 is seen on the right side and a pair of relay housings 62 on the left.

Connections of the relays within the housings 62 are made to the terminal block arrangement 26 by means of pairs of the solder-receiving openings 50. It will be appreciated that individual pairs of leads from the relays in the relay housings 62 are connected together internally in conventional fashion as a result of normally open contacts being closed when a given relay is activated. Heavy current carrying relay leads extend down to the solder-receiving openings 50 at which point solder connections are made to the pairs of bus bars 26B and 26C. The output connections from the pairs of bus bars to individual loads are made at threaded holes 52 by means of threaded terminal screws 53, only one of which is shown.

In case of the transformer 60, suitable power leads extend from the transformer to the printed circuit leads 54, solder connections being made to the pair of bus bars 26A.

It will be understood that appropriately disposed grommets 56 enable physical connections for each of the individual bus bars to the printed circuit board 40. Also, that suitable openings 70 in the board permit the upper bent portions 26W of each of the bus bars 26B and 26C to extend through to the rear of the printed circuit board 40 so that the aforedescribed relay connections can be made.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

We claim:

1. A terminal block arrangement for a timer device or system comprising:
   a circuit board having mounted thereon a low current circuit in which the current is approximately 1 to 10 amps, said circuit including a plurality of interconnected components;
   a relay connected in said low current circuit, said relay having contacts for closing a separate, normally open, high-current circuit;
   said relay having a housing, and leads connected internally of said housing to said contacts and extending from said housing;
   a terminal block assembly having at least two spaced terminal bus bars with one end of each bus bar disposed directly below said relay;
   means for directly connecting said leads to the ends of said bus bars.

2. Apparatus as defined in claim 1, in which said high current is at least 30 amps.

3. Apparatus as defined in claim 1, in which said individual bus bars are constituted of copper and the dimensions thereof are approximately 1 inch in length, ½ inch in width, and 1/5 inch in thickness.

4. Apparatus as defined in claim 1, in which said circuit board has two parallel planar surfaces the other ends of said bus bars being disposed on one surface adjacent one edge of said circuit board for easy access.

5. Apparatus as defined in claim 1, in which at least six spaced terminal bus bars are included.

6. Apparatus as defined in claim 1, said circuit board having openings extending through said board from said first planar surface to said second planar surface, each of said bus bars being bent or jogged so that said one end fits in the respective opening of said circuit board.

* * * * *